United States Patent
Hu

(10) Patent No.: US 8,042,605 B2
(45) Date of Patent: Oct. 25, 2011

(54) HEAT CONDUCTION DEVICE

(75) Inventor: Jun-Liang Hu, Choing Qing (CN)

(73) Assignee: Molex Incorporated, Lisle, IL (US)

( * ) Notice: Subject to any disclaimer, the term of this patent is extended or adjusted under 35 U.S.C. 154(b) by 1078 days.

(21) Appl. No.: 10/582,463

(22) PCT Filed: Dec. 10, 2004

(86) PCT No.: PCT/US2004/041677
§ 371 (c)(1),
(2), (4) Date: Mar. 12, 2007

(87) PCT Pub. No.: WO2005/059465
PCT Pub. Date: Jun. 30, 2005

(65) Prior Publication Data
US 2007/0272390 A1 Nov. 29, 2007

(51) Int. Cl.
*H05K 7/20* (2006.01)
(52) U.S. Cl. .................. 165/80.3; 361/697
(58) Field of Classification Search ............. 165/80.3, 165/185; 361/697, 704, 710
See application file for complete search history.

(56) References Cited

U.S. PATENT DOCUMENTS

| | | | |
|---|---|---|---|
| D205,770 S * | 9/1966 | Cos | D13/179 |
| 3,457,988 A * | 7/1969 | Meyerhoff et al. | 165/80.3 |
| 4,688,077 A * | 8/1987 | Wakabayashi et al. | 257/713 |
| 6,253,452 B1 * | 7/2001 | Chen et al. | 29/890.05 |
| 6,386,274 B1 * | 5/2002 | Wang et al. | 165/80.3 |
| 6,450,250 B2 * | 9/2002 | Guerrero | 165/104.33 |
| 6,657,865 B1 | 12/2003 | Tseng et al. | |
| 6,851,467 B1 * | 2/2005 | Bamford et al. | 165/80.3 |
| 2002/0080582 A1 * | 6/2002 | Chang | 361/700 |
| 2003/0209342 A1 | 11/2003 | Hsin et al. | |
| 2004/0016533 A1 * | 1/2004 | Wagner | 165/80.3 |
| 2005/0211416 A1 * | 9/2005 | Kawabata et al. | 165/80.3 |

FOREIGN PATENT DOCUMENTS

EP 1 081 760 A2 3/2001

* cited by examiner

*Primary Examiner* — Allen Flanigan
(74) *Attorney, Agent, or Firm* — Timothy M. Morella

(57) ABSTRACT

A heat conduction device is fixed into a radiator (2) and abutted a heat-generating component (42). This radiator (2) has a through-hole (10). The heat conduction device includes a column body (1). One end of the column body (1) is recessed to form a hollow part in order to increase the radiating surface; the other end of the column body (1) is a contact surface (12). The outer surface of the column body (1) is fixed inside the through-hole (10) of the radiator (2), the contact surface (12) is abutted the heat generating component (42); Due to the formation of the hollow part, the radiating surface is increased, the radiating effect is enhanced, and the cost can be decreased greatly due to the simple configuration of the column body (1).

16 Claims, 5 Drawing Sheets

HEAT CONDUCTION DEVICE

FIELD OF THE INVENTION

The present invention relates to a heat conduction device, especially related to a heat conduction device with high radiating efficiency.

BACKGROUND OF THE INVENTION

As is generally known, electronic devices include a radiator assembly to cool the heat-generating component mounted on a circuit board located within the electronic device. The radiator assembly includes radiators and heat conduction device. The radiator consists of radiating fins. The heat conduction device is fixed into the radiator and abutted against the heat-generating component.

Conventional heat conduction devices, such as heat pipes and thermal columns, include a heat pipe to provide a capillary structure therein, and the heat pipe orifice is sealed after the working fluid is placed in the heat pipe. The thermal column provides structure therein to realize the radiating effect through the phase change of the working fluid.

In the above conventional heat conduction devices, the radiating surface of the heat pipe or thermal column is only limited to its external wall, thus the radiating degree is limited. Moreover, because of the complexity of the components and the high difficulty of the assembly, the price is very high and the anticipative radiating effect may be affected due to the difficulty of the quality control.

Thus it can be seen that the above conventional heat conduction device described above needs to be improved.

OBJECTS AND SUMMARY OF THE INVENTION

One object of the present invention is to provide a new heat conduction device to enhance its radiating surface and increase its radiating effect.

Another object of the present invention is to provide a simplified heat conduction device which is easily produced, thereby reducing the cost of the heat conduction device.

In order to accomplish the above objects, a heat conduction device is provided for fixing into a radiator and abutting a heat generating component, the radiator comprising a through-hole, the heat conduction device includes a column body, one end of the column body is recessed to form a hollow part in order to increase the radiating surface; the other end of the column body is a contact surface. The outer surface of the column body is fixed to the inside surface of the through-hole of the radiator; the contact surface is abutted to the heat generating component.

Due to the formation of the hollow part, the radiating surface is increased and the radiating efficiency is enhanced. Moreover, because the configuration of the column body is simple and the hollow part is easy to be formed, the cost can be reduced greatly.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE DISCLOSED EMBODIMENTS

Figure 1:
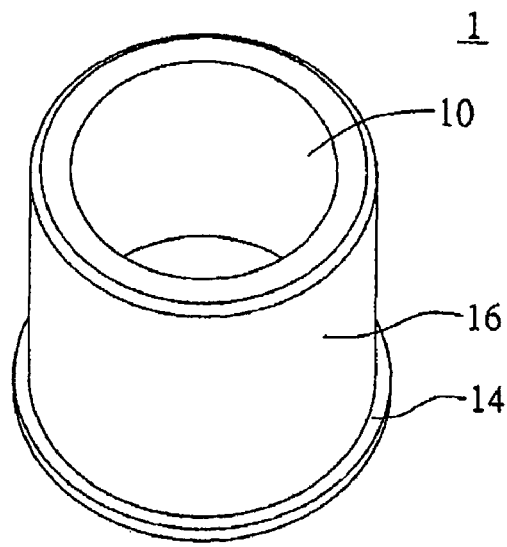
FIG. 1 is a perspective view of the heat conduction device of the present invention.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 2:
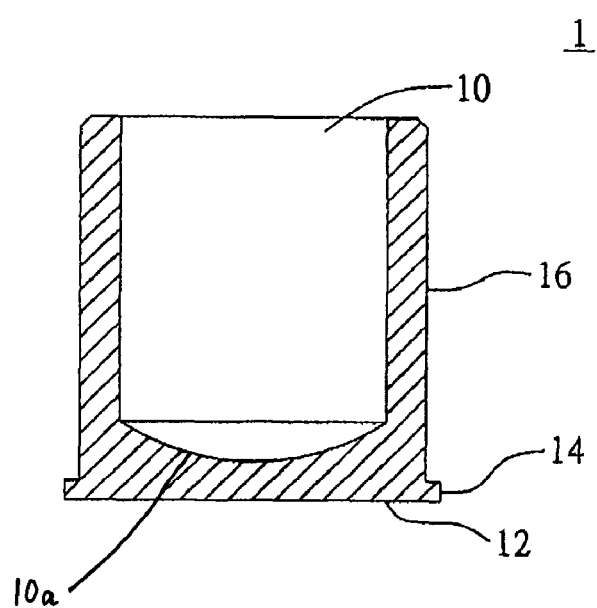
FIG. 2 is a cutaway view of the heat conduction device of the present invention.
Figure 6:
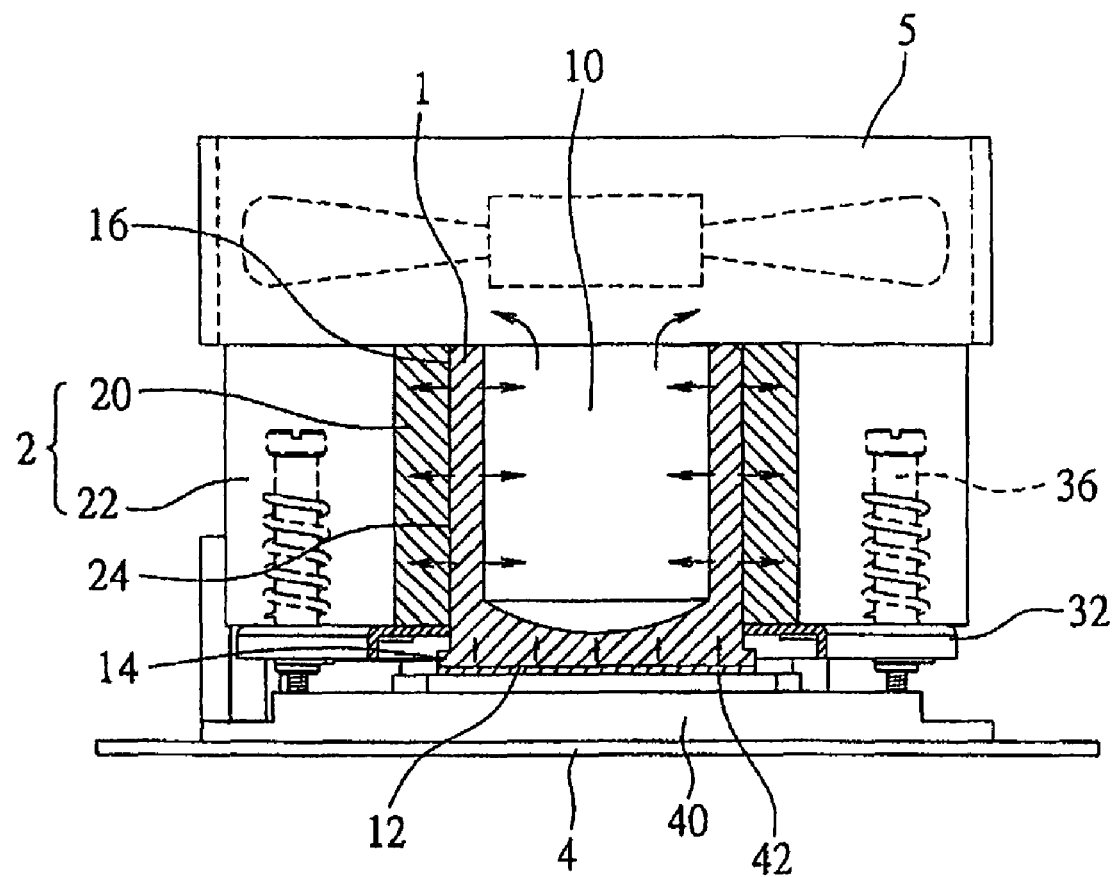
FIG. 6 is a cutaway view of the radiator assembly with a radiating fan mounting on the radiator, the clamp fixing on the circuit board, and the heat conduction device abutting the heat-generating component of the present invention.

As it is showed in FIG. 1 and FIG. 2, the present invention provides a heat conduction device. Referring to FIG. 6, the heat conduction device is fixed into a radiator 2 and abutted a heat-generating component 42. The heat conduction device includes column body 1.

The column body 1 of the embodiment of the present invention is configured to be cylindrical shape, although it can be other shapes dependent on the requirement. One end of the column body 1 is recessed to form a hollow part 10 in order to increase the radiating surface. In this embodiment, the bottom end 10a of the hollow part 10 is bowl-like or other free shapes, such as planar in shape. Moreover, the hollow part 10 constitutes a substantial portion of the total height of the column body 1. The other end of the column body 1 is planar contact surface 12. The contact surface 12 of the column body extends outwardly in a radial direction to form a flange 14. The material of the column body 1 is preferably copper with high heat conductivity. As shown in FIG. 1 and FIG. 2, the configuration of the column body 1 is simple and the hollow part 10 is easily produced. As such, the production cost of the column body 1 is very low.

Figure 3:
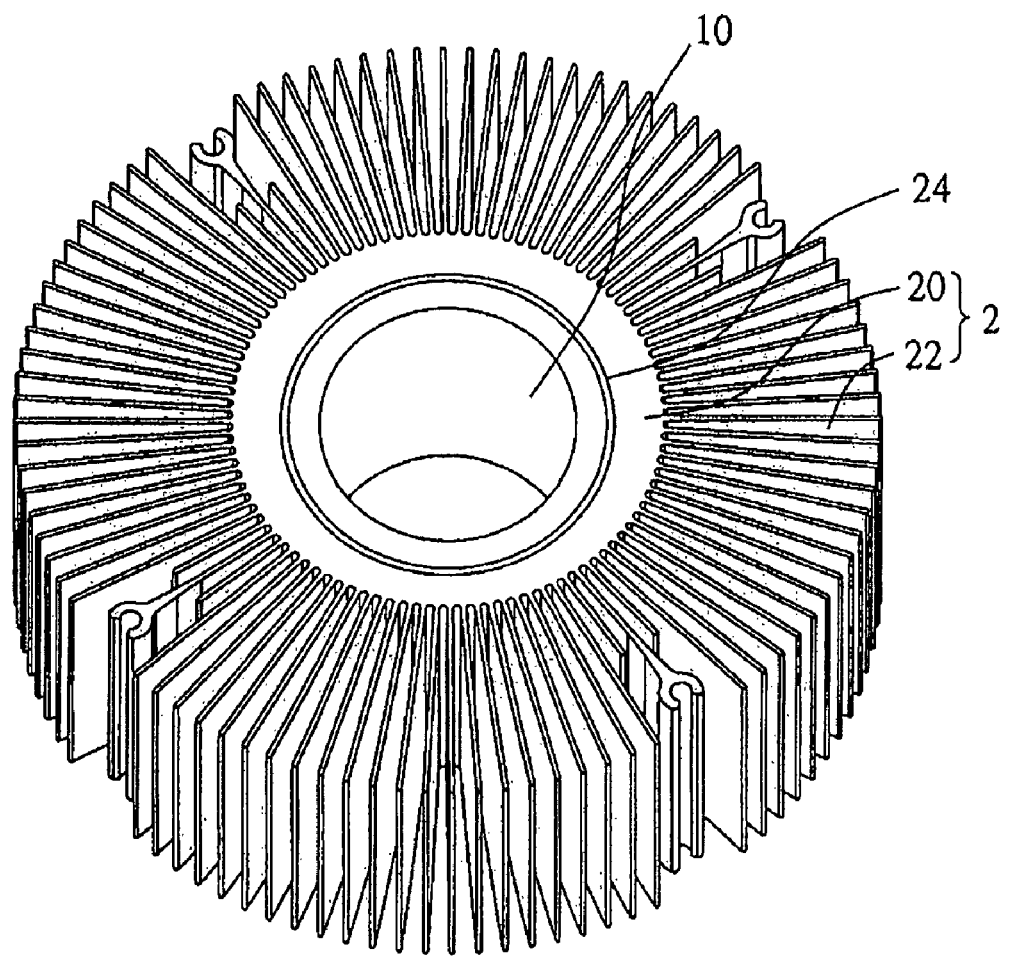
FIG. 3 is a perspective view of the heat conduction device fixing into the radiator of the present invention.
Figure 4:
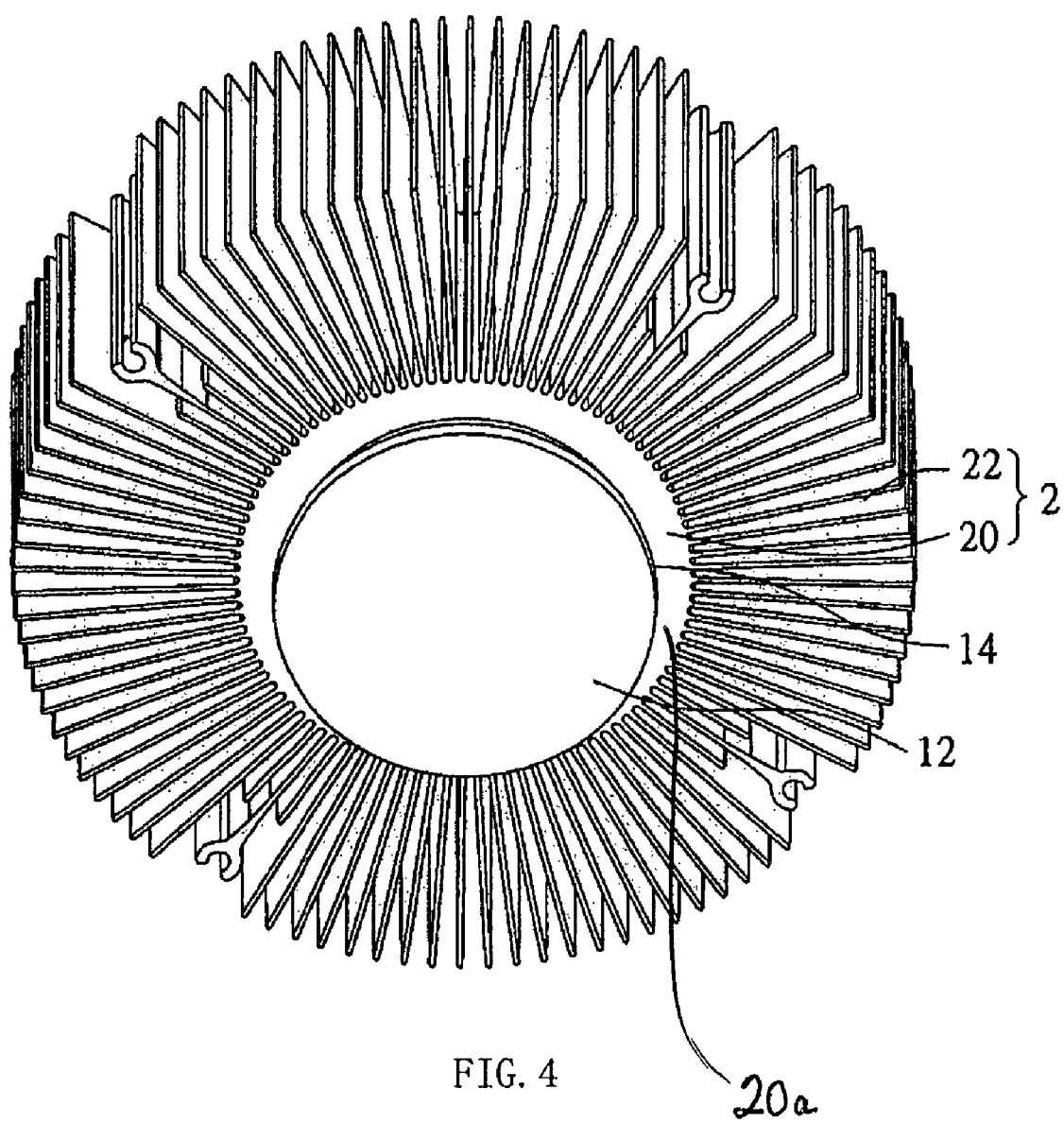
FIG. 4 is a perspective view of the heat conduction device fixing into the radiator of the present invention in another angle.

Referring to FIG. 3 and FIG. 4, the radiator 2 of the embodiment consists of a base part 20 and a plurality of radiating fins 22, the base part 20 having a through-hole 24 in the center thereof, and the radiating fins 22 radially extending outward from the periphery of the base part 20. The material of the radiator 2 is preferably copper with high heat conductivity in order to form the said structure by extrusion. However, the radiator may be formed by other conventional means. The external diameter of the column body 1 mates with the inner diameter of the through-hole 24 of the radiator 2. The outer diameter of the flange 14 of the column body 1 is larger than the diameter of the through-hole 24 of the radiator 2. The external surface 16 of the column body 1 is disposed to be adjacent the through-hole 24. Solder is applied to either or both of the external surface 16 of the body and the through hole 24, and the column body 1 and the radiator 2 are fixed at an appropriate position as a result of the interaction between the flange 14 and a bottom surface 20a of the radiator 2. Next, the combination of the column body 1 and the radiator 2 is put it a soldering oven to fix the external surface 16 of the column body 1 to the through-hole 24 of the radiator 2 by the solder.

Figure 5:
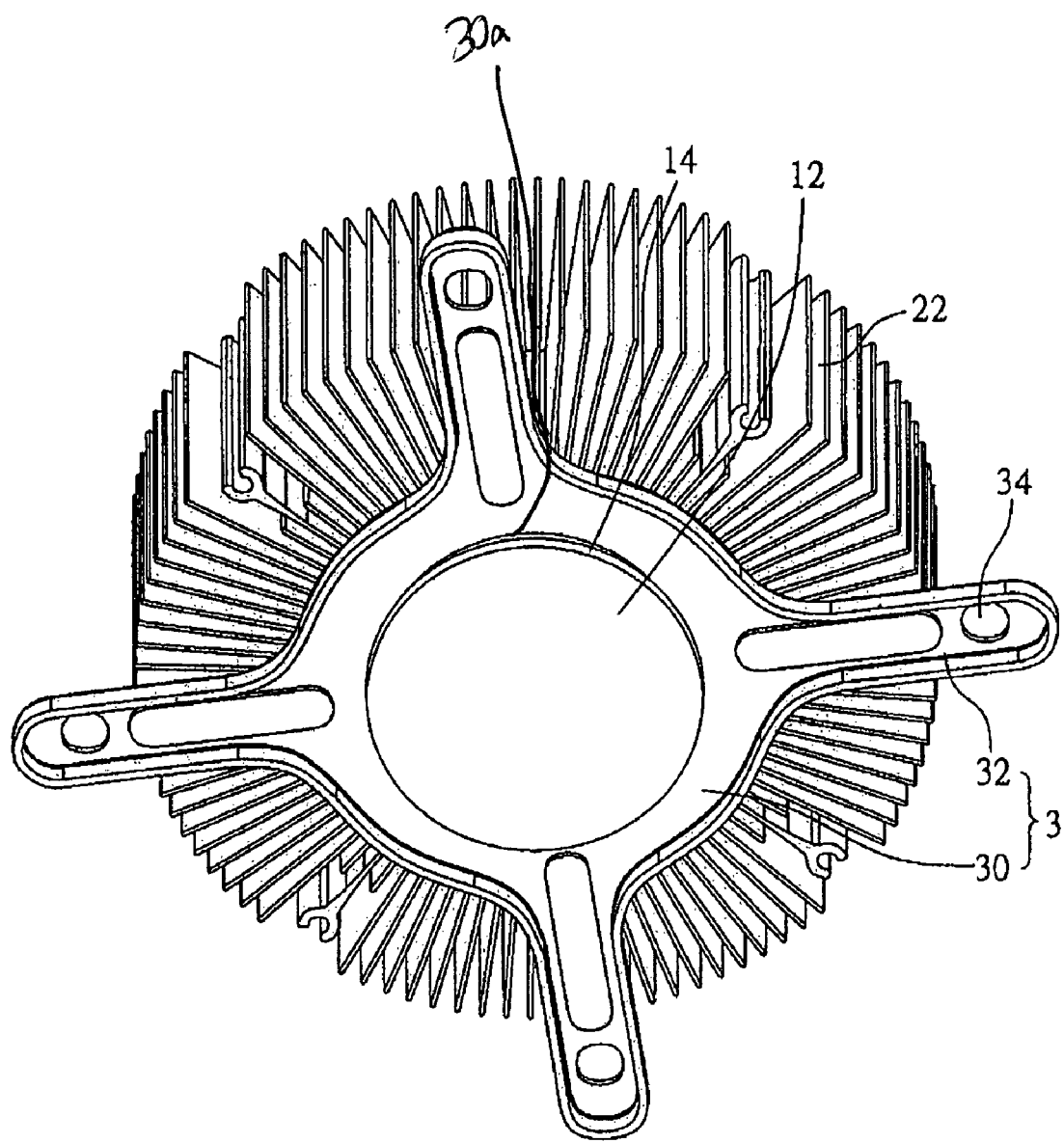
FIG. 5 is a perspective view of the radiator assembly with a clamp between the heat conduction device and the radiator of the present invention.

As shown in FIG. 5, the column body 1 for the heat conduction device of present invention is fixed into the radiator 2, and a clamp 3 is placed between the flange 14 and the bottom surface 20a of the base part 20 in order to allow the heat conduction device to be fixed on the circuit board 4 (Showed in FIG. 6). The clamp 3 includes a ring part 30 and a plurality of support parts 32. The ring part 30 includes an opening 30a which has a diameter that is smaller than the outside diameter of the flange 14 of the column body 1. The support parts 32 extend outwardly from the external edge of the ring part 30. Each of the support parts includes a through-hole 34 therein. The column body 1 is set through the opening of the ring part 30 of the clamp 3, then set through the through-hole 24 of the radiator 2 so that the ring part 30 of the clamp 3 is located between the flange 14 of the column body 1 and the radiator 2. Thus, a radiating assembly is formed which can be fixed on the circuit board 4 using fixing members 36 arranged through the through-holes 34 of the support parts 32 respectively.

As it is showed in FIG. 6, the circuit board 4 provides a window-type base frame 40 for receiving the heat-generating component 42. The heat-generating component 42, such as the central processing unit (CPU), can also be a heat conduction board, which could transfer heat from the heat-generating component.

A fan 5 is disposed and fixed on the top surface of the radiator 2. The clamp 3 of the radiating assembly is firmly fixed on the base frame 40 of the circuit board 4, with the contact surface 12 of the column body 1 of the heat conduction device abutting the heat-generating component. The heat generated from the heat-generating component 42 is conducted to the contact surface 12 of the column body 1 of the heat conduction device of the present invention. The heat conduction device can conduct heat to the outer surface 16 of the column body 1, which is then transferred to the radiating fins 22 of the radiator 2, and besides, which can also conduct heat to the surface of hollow part 10 of the column body 1, thus the radiating area is increased. The cooling air generated by the radiating fan 5 not only carries away the heat from the radiating fins 22, but also carries away the heat from the surface of the hollow part 10 of the column body 1, thus the radiating effect is enhanced.

As described above, the advantages of the heat conduction device of the present invention include the fact that one end of the column body is recessed to form a hollow part. In addition, the inner surface of this hollow part can increase the radiating surface, and then enhances the radiating effect. Moreover, the configuration of the column body is simple and the hollow part is easy to be formed, so the cost can be reduced greatly.

Although a preferred embodiment of the present invention has been described for illustrative purpose, those skilled in the art will appreciate that various modifications, additions and substitutions are possible, without departing from the scope and spirit of the invention as recited in the accompanying claims.

What is claimed is:

1. A heat conduction device for dissipating heat from a heat-generating component, the heat conduction device comprising:
    a radiator, the radiator having a top surface and a bottom surface, the radiator further having a through-hole extending from the top surface to the bottom surface and a fan mounted to an upper surface thereof; and
    a column body received within the radiator through-hole, the column body having a first end and a second end, the first end having a recess therein that forms a hollow portion to increase the radiating surface and the second end having a contact surface for receiving heat from the heat generating component, wherein the column body has a height at least approximately the distance between the top surface and the bottom surface of the radiator and wherein the recess is defined by an inner wall that extends continuously in a direction away from the second end.

2. The heat conduction device according to claim 1, wherein the contact surface of the column body extends out radially to form a flange, wherein the radiator through-hole is round, and where the radius of the flange is larger than that of the through-hole.

3. The heat conduction device according to claim 2, wherein a clamp is disposed between the flange of the column body and the radiator.

4. The heat conduction device according to claim 3, wherein the clamp includes a ring part and a plurality of support parts, the ring part including an opening therein, and wherein the opening has a diameter that is smaller than the radius of the flange.

5. The heat conduction device according to claim 4, wherein the support parts extend outwardly from the ring part.

6. The heat conduction device according to claim 4, wherein the support parts include a through hole.

7. The heat conduction device according to claim 3, further including a circuit board, the clamp being used to retain the heat conduction device to the circuit board.

8. The heat conduction device according to claim 1, wherein the column body is cylindrical.

9. The heat conduction device according to claim 1, wherein a bottom portion of the hollow portion is bowl-like.

10. The heat conduction device according to claim 1, wherein the column body is made of copper.

11. The heat conduction device according to claim 1, wherein the column body is made of copper and the radiator is made of aluminum.

12. The heat conduction device according to claim 1, wherein the radiator includes a base part and a plurality of radiating fins, the base part having said through-hole, the radiating fins extending out radially from an outer surface of the base part.

13. The heat conduction device according to claim 1, wherein solder is applied to at least one of an external surface of the column body and the radiator through-hole to fix the column body to the radiator.

14. The heat conduction device according to claim 1, wherein the contact surface of the column body includes a flange that extends from the column body, the flange being sized so that it is larger than the radiator through-hole.

15. The heat conduction device according to claim 1, wherein the radiator through-hole is round.

16. The heat conduction device according to claim 1, wherein the radiator includes a plurality of fins.

* * * * *